United States Patent
Benzinger et al.

(10) Patent No.: US 7,378,762 B2
(45) Date of Patent: May 27, 2008

(54) ELECTRICAL CIRCUIT FOR LIMITING SWITCHING-ON CURRENT

(75) Inventors: Rupert Benzinger, Finsing (DE); Hannes Serro, München (DE); Michael Keller, München (DE)

(73) Assignee: Agfa-Gevaert Healthcare GmbH, Leverkusen (DE)

( * ) Notice: Subject to any disclaimer, the term of this patent is extended or adjusted under 35 U.S.C. 154(b) by 475 days.

(21) Appl. No.: 10/926,878

(22) Filed: Aug. 26, 2004

(65) Prior Publication Data

US 2005/0088157 A1    Apr. 28, 2005

(30) Foreign Application Priority Data

Oct. 24, 2003 (EP) ................. 03103955.5

(51) Int. Cl.
- H01H 3/00  (2006.01)
- H01H 9/54  (2006.01)
- H01H 33/59  (2006.01)
- H01H 47/00  (2006.01)
- H01H 85/46  (2006.01)

(52) U.S. Cl. ..................... 307/139; 307/141
(58) Field of Classification Search ............. 307/139, 307/141; 323/282
See application file for complete search history.

(56) References Cited

U.S. PATENT DOCUMENTS

| 5,283,707 A | 2/1994 | Conners et al. ............... 361/58 |
| 5,374,887 A | 12/1994 | Drobnik ....................... 323/299 |
| 5,635,804 A | 6/1997 | Tanaka et al. ............... 318/139 |
| 6,320,283 B1 | 11/2001 | Jud et al. ..................... 307/125 |
| 6,735,064 B2 * | 5/2004 | Miyazaki ....................... 361/58 |

FOREIGN PATENT DOCUMENTS

| DE | 41 21 055 A1 | 1/1993 |
| DE | 100 32 197 A1 | 1/2002 |
| EP | 03 10 3955 | 3/2004 |
| FR | 1.448.312 | 8/1966 |

* cited by examiner

*Primary Examiner*—Michael Sherry
*Assistant Examiner*—Carlos Amaya
(74) *Attorney, Agent, or Firm*—Houston Eliseeva LLP

(57) ABSTRACT

The invention concerns an electrical circuit for limiting the switching-on current through a load during a switching-on process, comprising an electrical component which is connected in series to the load. To ensure current limitation which is independent of the load and of the value of the supply voltage, and simultaneously to avoid switching current peaks and minimize dissipated heat, the current-limiting component is in the form of an active component which has an internal resistance, and which is controlled by a timing element in such a way that the internal resistance of the component is reduced during a switching-on process.

19 Claims, 3 Drawing Sheets

ELECTRICAL CIRCUIT FOR LIMITING SWITCHING-ON CURRENT

FIELD OF THE INVENTION

The present invention concerns an electrical circuit for limiting the switching-on current through a load during a switching-on process.

BACKGROUND OF THE INVENTION

From DE 41 21 055 A1, a circuit arrangement is known for limiting the switching-on current of incandescent bulbs. The circuit arrangement includes a protective resistor connected in series to an incandescent bulb. Parallel to the protective resistor, a switching transistor, which is controlled by an ignition transistor, is provided. The ignition transistor is fed on the input side with the voltage drop which occurs on the incandescent bulb. After the supply voltage is switched on, the voltage drop on the incandescent bulb gradually increases, because the resistance of the incandescent bulb increases as the operating temperature increases. When a specified voltage drop on the incandescent bulb is reached, the ignition transistor switches through, and controls the switching transistor in such a way that it also switches through, and thus bridges the protective resistor, so that the current through the incandescent bulb is no longer limited by the protective resistor.

With this circuit arrangement according to the prior art, the effect of the current limitation is heavily dependent on the type of load and the value of the supply voltage, so that the circuit arrangement must be newly dimensioned for each load and each supply voltage. Additionally, at the instant when the switching and ignition transistors are switched through, high switching current peaks can occur briefly. These can load the supply voltage source as well as cause damage to the load. Also, with this circuit arrangement, even after the switching transistor is switched through, a finite voltage drop occurs between the collector and emitter of the switching transistor, and/or at the protective resistor, resulting in production of dissipated heat.

SUMMARY OF THE INVENTION

An object of the invention is to give an electrical circuit of the above-mentioned type a current-limiting effect which is independent of the load and the value of the supply voltage, and with which switching current peaks are avoided and the generation of dissipated heat is minimized.

This object is achieved by a current-limiting electrical component which is connected in series to the load and which is in the form of an active component having an internal resistance, and by providing a timing element, which controls the component in such a way that the internal resistance of the component during the switching-on process is reduced.

The invention is based on the idea of using as the current-limiting component, instead of an ohmic protective resistor, an active component, e.g., a transistor, which is controlled by a timing element. The switching-on current through the load is limited by the voltage drop at the internal resistance of the active component. The timing element, which is independent of the load, controls the component in such a way that its internal resistance is reduced during the switching-on process, until finally, at the end of the switching-on process, current limitation no longer occurs.

By means of the timing element to control the active component, a current limitation which is independent of the consumer and the value of the supply voltage is achieved. Additionally, the active component can be controlled in such a way that its internal resistance is continuously reduced, so that switching current peaks can be avoided. Further, with the circuit according to the invention, after the end of the switching-on process only a negligibly small voltage drop occurs at the active component, particularly between the collector and emitter of a transistor, so that heat dissipation is greatly reduced.

In a preferred version, it is provided that the timing element is in such a form that the internal resistance of the component is reduced continuously during the switching-on process. In this way, any switching current peaks are avoided with high reliability, and simultaneously switching-on which is gentle and easy on the load is achieved.

It is preferred that the internal resistance of the component is reduced exponentially during the switching-on process. In this way, on the one hand it is achieved that the internal resistance of the component becomes very low after a specifiable duration of the switching-on process, and thus power losses at the component after the switching-on process ends are negligible. On the other hand, because of the exponential drop of the internal resistance of the component, power losses during the switching-on process are greatly reduced. Altogether, the exponential reduction of the internal resistance of the component results in a very low power dissipation, and thus low thermal stress on the component and the electrical circuit.

Preferably, the behavior of the timing element over time is independent of the load. This ensures that the duration of the switching-on process and its course over time are not affected by parameters of the load, e.g., the load resistance and/or its thermal behavior.

In a preferred version of the invention, it is provided that the timing element includes a capacitor and a first ohmic resistor, via which the capacitor can be charged. By means of such a so-called RC element, the timing element can be simply and reliably implemented.

Preferably, the capacitor of the timing element can be charged by a switching-on voltage which is present at the timing element at least during the switching-on process, and which is independent of the supply voltage of the load. In this way, the independence of the current limitation from the properties of the load and of the supply voltage is ensured in a very reliable way.

As the active component, preferably a transistor is used, in particular a field effect transistor. The field effect transistor is preferably in the form of a MOS field effect transistor (MOSFET). This makes it possible to limit the switching-on current with very low dissipated heat.

Preferably, at least part of the electrical circuit according to the invention is implemented as an integrated circuit. As well as switching-on the circuit more compact, this makes simpler replaceability in the case of a defect or for maintenance purposes possible.

Preferably, the integrated circuit has two terminals to which the capacitor of the timing element can be connected. By choosing the capacitance of the capacitor, which is in the form of a discrete component, the behavior of the timing element over time, and thus the switching-on current limitation, particularly the duration of the switching-on process, can easily be chosen, without it being necessary to replace the integrated circuit.

Similarly, the integrated circuit can have two terminals, to which the first ohmic resistor of the timing element can be connected. In this way too, the behavior of the timing element over time can easily be chosen. For instance, the ohmic resistor can be in the form of an adjustable resistor, e.g., a rotary potentiometer, which makes adjusting the behavior over time very easy.

Preferably, the integrated circuit is in the form of a surface-mounted device (SMD), which makes it very easy to assemble the electrical circuit, particularly in association with the discretely constructed capacitor and/or first ohmic resistor.

BRIEF DESCRIPTION OF THE DRAWINGS

Below, the invention and other preferred embodiments of the invention are explained in more detail on the basis of figures.

DETAILED DESCRIPTION OF THE INVENTION

Figure 1:
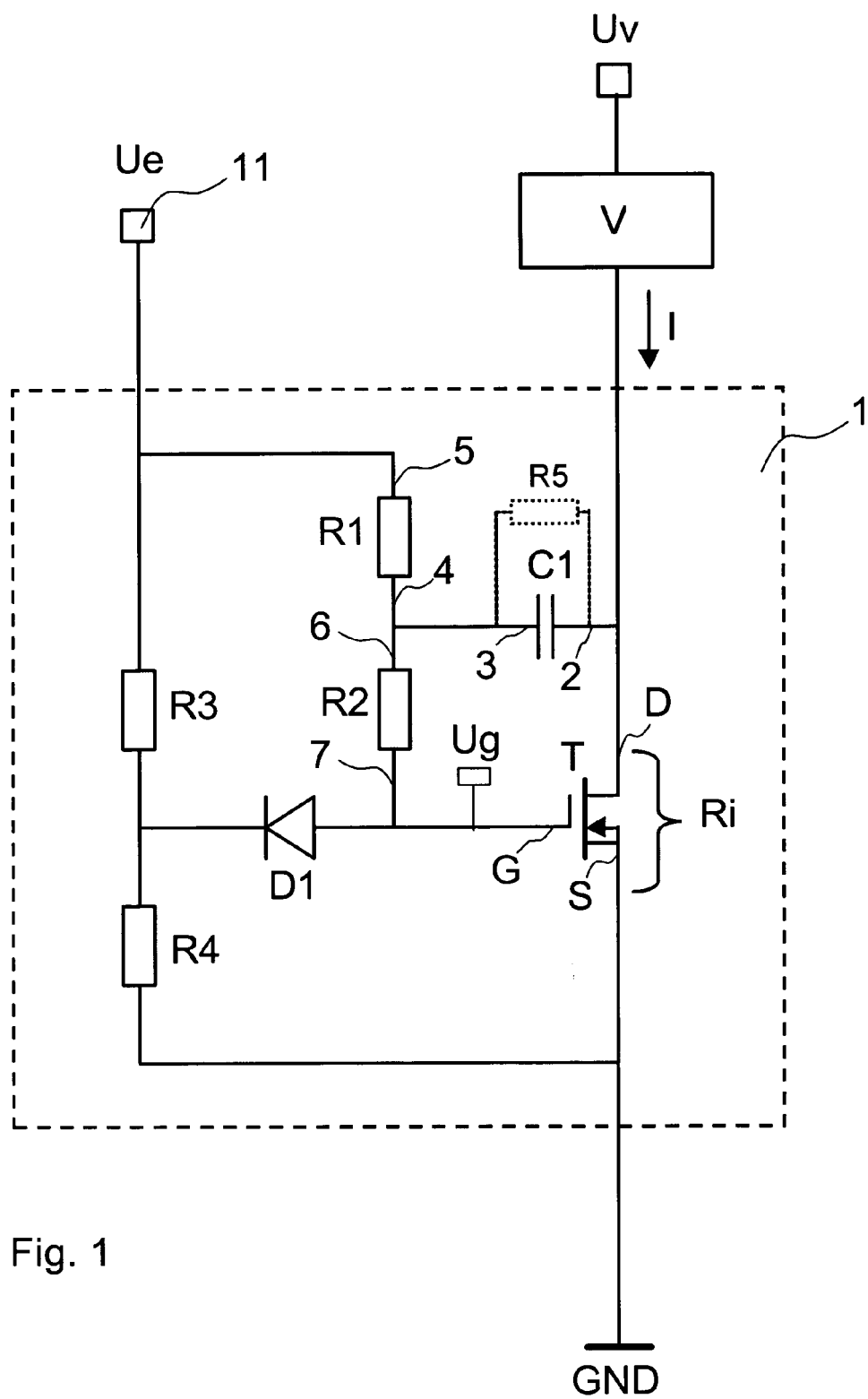
FIG. 1 shows an electrical circuit according to the invention, in a first embodiment.

FIG. 1 shows an electrical circuit 1 according to a first embodiment of the invention. In series with a DC load V, a transistor T, in this example a MOS field effect transistor (MOSFET), is connected, and is controlled by a timing element, which includes a first ohmic resistor R1 and a capacitor C1.

A first terminal 2 of the capacitor C1 is connected to an input D of the transistor T. A second terminal 3 of the capacitor C1 is connected to a first terminal 4 of the first ohmic resistor R1. The second terminal 3 of the capacitor C1 is also connected to a first terminal 6 of a second ohmic resistor R2, the second terminal 7 of which is connected to a control terminal G of the transistor T.

The control terminal G of the transistor T is connected via a diode D1 and a third ohmic resistor R3 to a second terminal 5 of the first ohmic resistor R1. Additionally, the control terminal G is connected via the diode D1 and a fourth ohmic resistor R4 to an output S of the transistor T. The output S of the transistor T is also connected to ground GND, and the input D of the transistor T is connected to the load V, which in turn is connected to the supply voltage Uv.

At the second terminal 5 of the first ohmic resistor R1, a first terminal 11, to which a switching-on voltage Ue can be applied at least during the switching-on process, is provided.

The electrical circuit 1 shown in FIG. 1 can be implemented fully or partly as an integrated circuit, i.e., all or some components of the electrical circuit 1 can be integrated on a chip.

Figure 2:
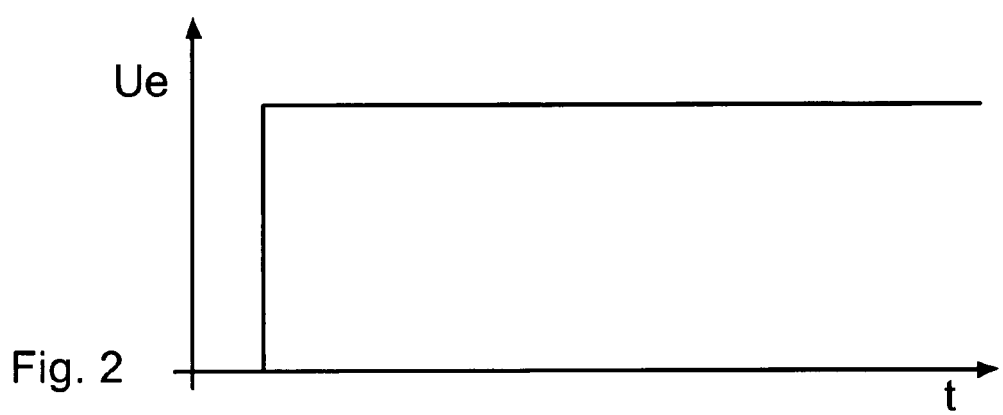
FIG. 2 shows the course of the switching-on voltage over time during the switching-on process.

Below, the method of functioning of the electrical circuit 1 shown in FIG. 1 is explained in more detail with reference to FIGS. 2 to 4.

If a switching-on voltage Ue is applied to the first terminal 11 of the electrical circuit 1 (see FIG. 2), a voltage Ug is set up at the control terminal G of the transistor T. Its course over time is shown in FIG. 3.

Figure 3:
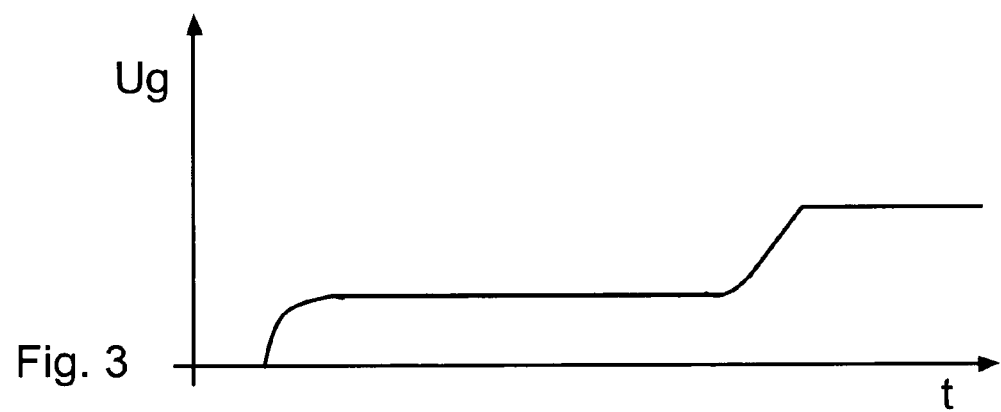
FIG. 3 shows the course of the voltage at the control terminal of the transistor over time.
Figure 4:
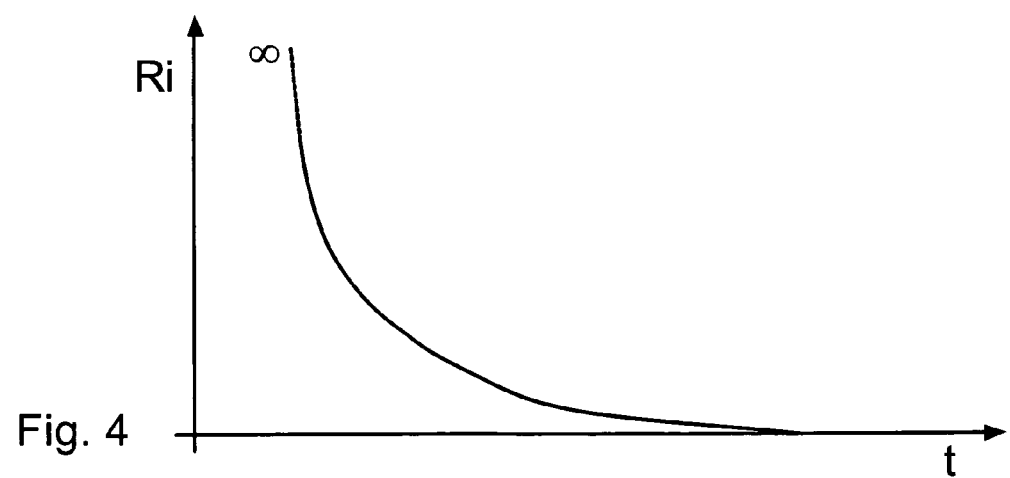
FIG. 4 shows the course of the internal resistance of the transistor over time.

According to FIG. 3, a voltage Ug is present at the control terminal G of the transistor T shortly after the start of the switching-on process, and somewhat reduces the initially very high internal resistance Ri of the transistor T. The second ohmic resistor R2 prevents the transistor T from being switched through completely for a short time before the process of charging the capacitor C1 begins.

The third and fourth ohmic resistors R3 and R4 divide the switching-on voltage Ue in such a way that the voltage Ug at the control terminal G of the transistor T cannot reach excessively high values. In this way, the transistor T is protected from excessively high control voltages Ug.

The process of charging the capacitor C1 via the first ohmic resistor R1, and the internal resistance Ri, which gradually becomes low, of the transistor T, also result in the course, which is shown in FIG. 3, of the voltage Ug at the control terminal G of the transistor T.

Because of this voltage course, the transistor T is controlled in such a way that its internal resistance Ri is brought from an initially high-resistance state into a low-resistance state, falling exponentially. This course over time of the internal resistance Ri of the transistor T is shown in FIG. 4. The high-resistance state at the start of the switching-on process is indicated in the figure by a dotted section of the resistance curve, tending to infinity ($\infty$).

Because of the exponentially falling internal resistance Ri of the transistor T, the switching-on current I through the load V is also limited over time, falling exponentially. After a specifiable duration of the switching-on process—typically between about 100 and 1000 milliseconds—the internal resistance Ri of the transistor T becomes very low, so that only a negligibly small voltage drop occurs at the transistor T, and thus almost the whole supply voltage Uv is present at the load V. The load V is now in the switched-on state, i.e., in normal operation.

To switch off the load V, the switching-on voltage Ue is removed or pulled to ground potential GND. The capacitor C1 discharges itself very quickly via the second, third and fourth ohmic resistors R2, R3 and R4 and the diode D1, so that the transistor T is blocked quickly—i.e., in the range of one or a few milliseconds—and thus the load V is switched off. Simultaneously, the second ohmic resistor R2 protects the transistor T at the control terminal G from any voltage peaks during switching off.

Figure 5:
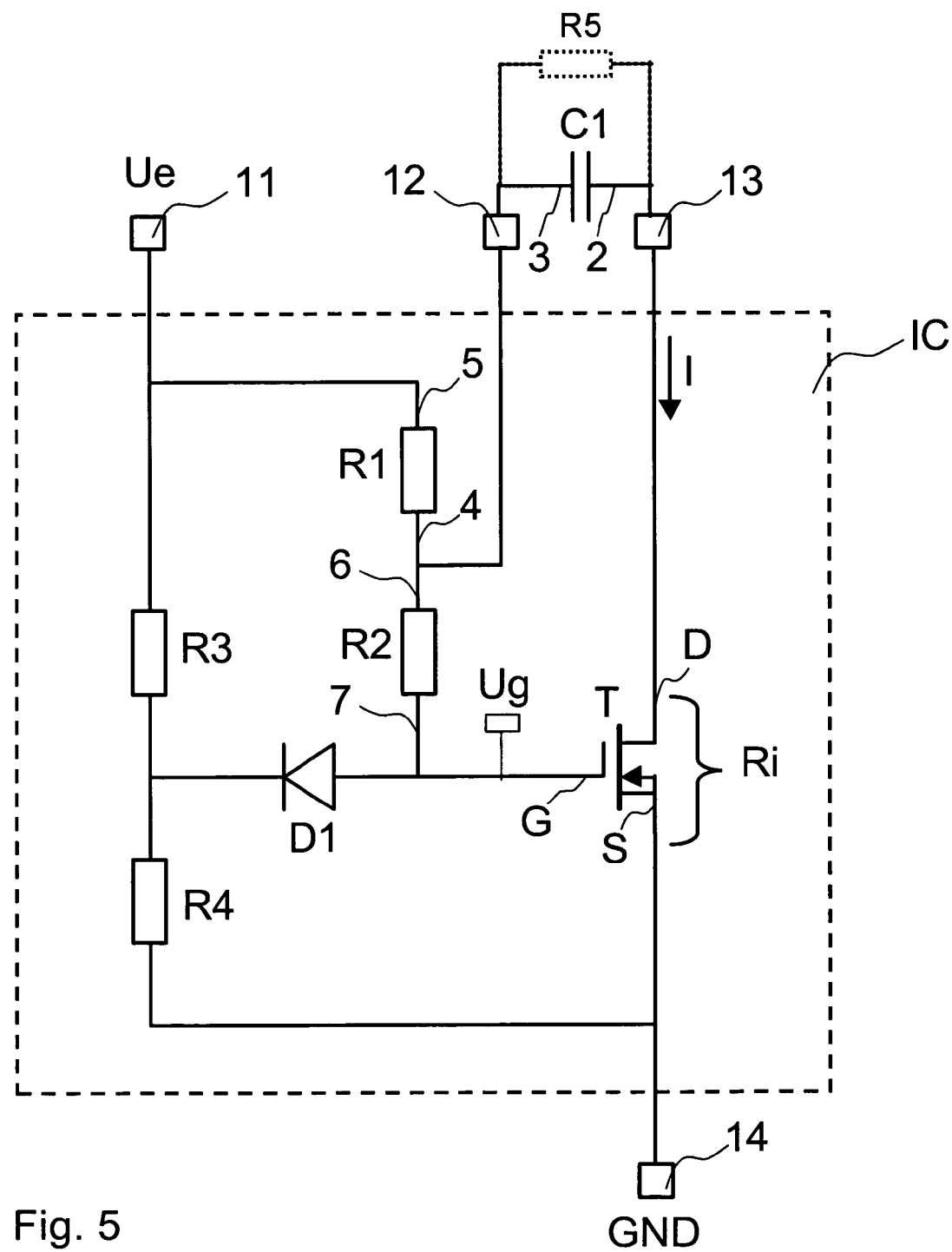
FIG. 5 shows a second embodiment of an electrical circuit according to the invention.

The second embodiment, which is shown in FIG. 5, of an electrical circuit according to the invention is partly implemented as an integrated circuit IC, in which the components of the circuit—except the capacitor C1—are integrated on a chip.

As well as a first terminal 11, to which the switching-on voltage Ue can be applied, the integrated circuit IC has a second and a third terminal 12 and 13 respectively, to which the capacitor C1, which is implemented as a discrete component, can be connected. By choosing the capacitance of the capacitor C1, the behavior of the integrated switching-on current limiter over time can easily be adjusted, without a differently dimensioned integrated circuit being required.

Additionally, the integrated circuit IC has a fourth terminal 14, which is preferably connected to ground GND, whereas the load V is connected to the third terminal 13, as in the embodiment shown in FIG. 1.

Since the behavior of the timing element over time is also affected by the first ohmic resistor R1, the integrated circuit C1 can also be implemented without a first ohmic resistor. The first ohmic resistor R1 of the timing element is then similarly connected externally, as a discrete component, to the first and second terminals 11 and 12 of the integrated circuit IC.

Otherwise, the explanations of FIGS. 1 to 4 apply correspondingly to the embodiment of FIG. 5.

In a further version of the invention, a fifth ohmic resistor R5 is provided, and is connected in parallel to the capacitor C1 of the timing element. The fifth resistor is drawn with dotted lines in the electrical circuits of FIGS. 1 and 5. By choosing a particular resistance value of the fifth ohmic resistor R5, the shape of the course, shown in FIG. 4, of the internal resistance Ri of the transistor T can be deliberately varied. In particular, the fifth ohmic resistor R5 is adjusted so that the curve of the internal resistance Ri falls as steeply as possible. The voltage at the transistor T thus falls correspondingly steeply, so that the dissipated power which occurs at the transistor T during the switching-on process is reduced. This results, in particular, in reduced heat generation, so that the transistor T and the whole electrical circuit are exposed to less thermal stress.

In the case of this version, a further diode (not shown) can optionally be connected in series to the fifth ohmic resistor R5. By this diode, a through-connection of the component T at the end of the switching-on process is ensured with very high reliability. Any heat dissipation at the transistor T is thus very reliably reduced.

Finally, it should also be mentioned that the properties of the switching-on current limitation can also be deliberately affected by the choice of the resistance of the second ohmic resistor R2. In particular, the threshold for the voltage drop at the transistor T at the start of the switching-on process can be defined by the choice of the second ohmic resistor R2.

The invention claimed is:

1. An electrical circuit to limit the switching-on current through a load during a switching-on process, comprising:
   a transistor with an input connected to the load, an output and a control terminal, the transistor having an internal resistance; and
   a timing element, which controls the transistor to reduce the internal resistance during the switching-on process, wherein the timing element includes a capacitor and a first ohmic resistor, via which the capacitor is charged, and wherein a first terminal of the capacitor is connected to the input of the transistor, a second terminal of the capacitor is connected to a first terminal of the first ohmic resistor, the second terminal of the capacitor is connected to a first terminal of a second ohmic resistor, and a second terminal of the second ohmic resistor is connected to the control terminal of the transistor.

2. An electrical circuit as claimed in claim 1, wherein the timing element controls the transistor to reduce the internal resistance of the transistor continuously during the switching-on process.

3. An electrical circuit as claimed in claim 1, wherein a behavior of the timing element over time is independent of the load.

4. An electrical circuit as claimed in claim 1, wherein the capacitor of the timing element is charged by a switching-on voltage, which is present at the timing element at least during the switching-on process.

5. An electrical circuit as claimed in claim 4, wherein at least part of the electrical circuit is implemented as an integrated circuit, and wherein the integrated circuit has one terminal to which the switching-on voltage is applied.

6. An electrical circuit as claimed in claim 1, wherein the transistor is a field effect transistor (FET).

7. An electrical circuit as claimed in claim 1, wherein the control terminal of the transistor is connected via a diode to a second terminal of the first ohmic resistor.

8. An electrical circuit as claimed in claim 1, wherein the control terminal of the transistor is connected via a diode to the output of the transistor.

9. An electrical circuit as claimed in claim 1, wherein at a second terminal of the first ohmic resistor, a switching-on voltage, via which the capacitor is charged, is applied at least during the switching-on process.

10. An electrical circuit as claimed in claim 1 wherein the output of the transistor is connected to ground.

11. An electrical circuit as claimed in claim 1, wherein at least part of the electrical circuit is implemented as an integrated circuit.

12. An electrical circuit as claimed in claim 11, wherein the integrated circuit has one terminal to which the load is connected.

13. An electrical circuit as claimed in claim 11, wherein the integrated circuit is in the form of a surface-mounted device.

14. An electrical circuit as claimed in claim 1, wherein at least part of the electrical circuit is implemented as an integrated circuit, and wherein the integrated circuit has two terminals to which the capacitor of the timing element is connected.

15. An electrical circuit as claimed in claim 1, wherein at least part of the electrical circuit is implemented as an integrated circuit, and wherein the integrated circuit has two terminals to which the first ohmic resistor of the timing element is connected.

16. An electrical circuit as claimed in claim 1, further comprising a another ohmic resistor in parallel with the capacitor of the timing element.

17. An electrical circuit as claimed in claim 1, wherein the timing element controls the transistor to reduce the internal resistance of the transistor exponentially during the switching-on process.

18. An electrical circuit as claimed in claim 1, wherein the control terminal of the transistor is connected via a third ohmic resistor to a second terminal of the first ohmic resistor.

19. An electrical circuit as claimed in claim 1, wherein the control terminal of the transistor is connected via another ohmic resistor to the output of the transistor.

* * * * *